United States Patent [19]
Zwicknagl et al.

[11] Patent Number: 5,340,755
[45] Date of Patent: Aug. 23, 1994

[54] METHOD OF MAKING PLANAR HETEROBIPOLAR TRANSISTOR HAVING TRENCHED ISOLATION OF THE COLLECTOR TERMINAL

[75] Inventors: Hans-Peter Zwicknagl, Stuttgart; Joachim Hoepfner, Planegg; Lothar Schleicher, Munich, all of Fed. Rep. of Germany

[73] Assignee: Siemens Aktiegensellschaft, Munich, Fed. Rep. of Germany

[21] Appl. No.: 912,271

[22] Filed: Oct. 13, 1992

Related U.S. Application Data

[60] Division of Ser. No. 821,855, Jan. 15, 1992, abandoned, which is a continuation of Ser. No. 575,795, Aug. 31, 1990, abandoned.

[30] Foreign Application Priority Data

Sep. 8, 1989 [EP]  European Pat. Off. ........ 89116665.4

[51] Int. Cl.⁵ ................... H01L 21/265; H01L 29/70
[52] U.S. Cl. .............................. 437/33; 437/61; 437/31; 437/67; 148/DIG. 72; 257/197; 257/517
[58] Field of Search ............ 437/31, 61, 62, 63, 437/33, 67; 148/DIG. 10, 11, 72; 257/197, 517

[56] References Cited

U.S. PATENT DOCUMENTS

| | | | |
|---|---|---|---|
| 4,318,751 | 3/1982 | Horng | 257/197 |
| 4,751,195 | 6/1988 | Kauri | 257/197 |
| 4,889,831 | 12/1989 | Ishii et al. | 437/31 |
| 4,933,732 | 6/1990 | Katoh et al. | 257/197 |
| 4,983,532 | 1/1991 | Mitani et al. | 148/DIG. 72 |
| 5,124,270 | 6/1992 | Morizuka | 257/197 |
| 5,185,214 | 2/1993 | Chang et al. | 437/31 |

FOREIGN PATENT DOCUMENTS

| | | | |
|---|---|---|---|
| 0416166 | 3/1991 | European Pat. Off. | 257/197 |
| 0095966 | 5/1985 | Japan | 437/31 |
| 0221151 | 9/1987 | Japan | 437/31 |
| 1831155 | 7/1989 | Japan | 257/197 |
| 0049432 | 2/1990 | Japan | 437/31 |
| 2188964 | 7/1990 | Japan | 257/197 |
| 2189931 | 7/1990 | Japan | 257/197 |
| 0292830 | 12/1990 | Japan | 437/31 |
| 0295127 | 12/1990 | Japan | 437/31 |
| 3008340 | 1/1991 | Japan | 257/197 |
| 4287331 | 10/1992 | Japan | 257/197 |

Primary Examiner—Olik Chaudhuri
Assistant Examiner—Long Pham
Attorney, Agent, or Firm—Hill, Steadman & Simpson

[57]  ABSTRACT

A planar heterobipolar transistor and its methods for manufacture provide that the transistor has the base-emitter region separated from the collector terminal by a collector parting trench and the parting trench structure may be used to separate the transistor from adjoining function components.

12 Claims, 5 Drawing Sheets

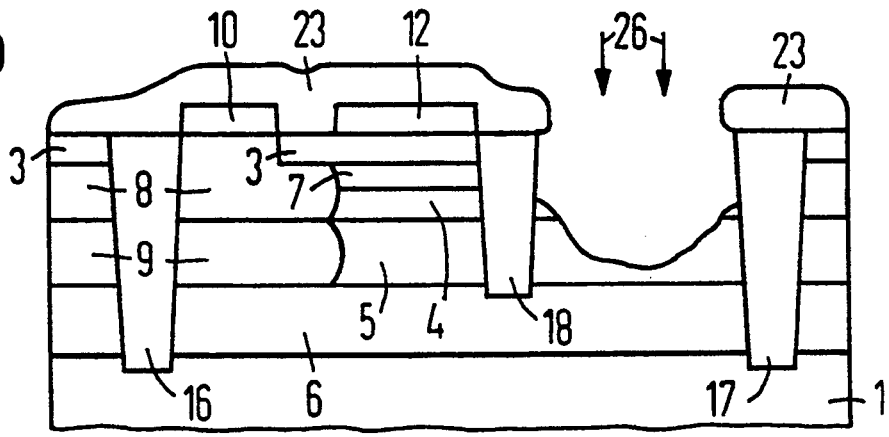
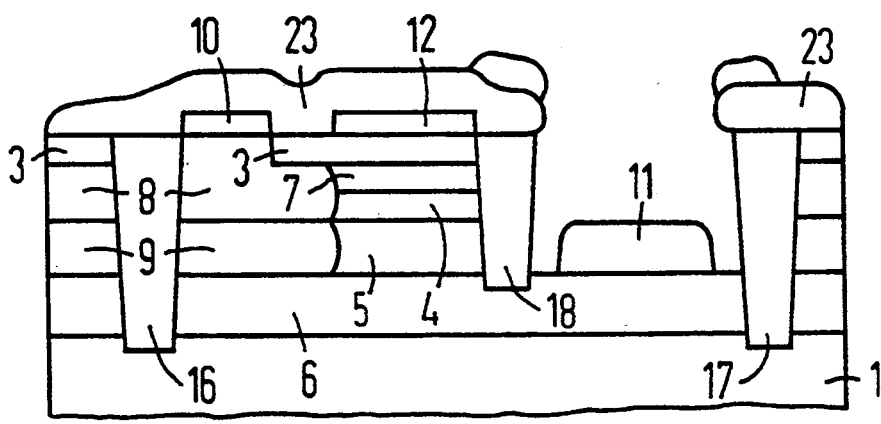
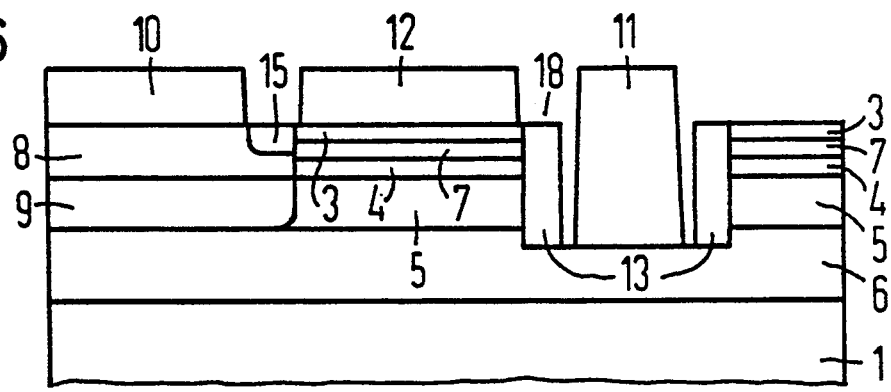

METHOD OF MAKING PLANAR HETEROBIPOLAR TRANSISTOR HAVING TRENCHED ISOLATION OF THE COLLECTOR TERMINAL

This is a division of application Ser. No. 07/821,855, filed Jan. 15, 1992 (now abandoned), which is a continuation of application Ser. No. 07/575,795, filed Aug. 31, 1990 (now abandoned).

BACKGROUND OF THE INVENTION

1. Field Of the Invention

The present invention relates to integrated circuits, and is more particularly concerned with integrated circuits having III-V heterobipolar transistors (HBT), in which planar transistors are desirable for a simple, reliable and structure-conforming connection. At the same time, requirements for highest switching speed are raised. What is particularly required of the design of the heterobipolar transistor is a minimum base-collector (B-C) boundary surface, i.e. a minimization of the parasitic B-C region. The contributions to the transit time in the transistor that, by now, are significant, in particular, the collector charging time and the emitter charging time, can be greatly reduced with this measure.

2. Description of the Prior Art

In non-self-aligned HBT processes or, respectively, in those processes having only a self-aligned base-emitter complex, an additional parasitic B-C surface arises that is established by length times spacing between the emitter and the collector or, respectively, between the base and the collector. The problem of obtaining a minimum B-C remains unresolved in these heterobipolar transistors. In this connection, one may take reference to, for example, the K. C. Wang, et al article "A 4-bit Quantizer Implemented with AlGaAs/GaAs Heterojunction Bipolar Transistors," GaAs IC-Symposium, Technical Digest, 1987, pp. 83–86, the Mau-Chung F. Chang, et al article "AlGaAs/GaAs Heterojunction Bipolar Transistors Fabricated Using a Self-Aligned Dual-Lift-Off Process", IEEE Electron Device Letters, Vol. EDL-8, No. 7 July 1987, pp. 303–305, the Kouhei Morizuka, et al article "AlGaAs/GaAs HBT's Fabricated by a Self-Alignment Technology, Using Polyimide for Electrode Separation", IEEE Electronic Device Letters, Vol. 9, No. 11, November 1988, pp. 598–600, and the K. Morizuka, et al article "Transit-Time Reduction in AlGaAs/GaAs HBT's utilizing Velocity Overshoot in the p-type Collector Region", IEEE Electron Device Letters, Vol. 9, No. 11, November 1988, pp. 585–587.

Another approximation is a totally self-aligned HBT wherein the emitter and the base, as well as the base and the collector or, respectively, the emitter and the collector are separated from one another by the interposition of insulating spacer layers that are less than 1 $\mu$m wide. The processes that have been set forth up to this point in the publications end in a double mesa structure that respectively combines the emitter and the base or, the base and the collector and has a pronounced surface topography. In this respect, one may refer to the Sadao Adachi, et al article "Collector-Up HBT's Fabricated by Be$^+$ and O$^+$ Ion Implantations", IEEE Electron Device Letters, Vol. EDL-7, No. 1, January 1986, pp. 32–34, the Mohammad Madihian, et al article "Fabrication and Modeling of a Novel Self-Aligned AlGaAs/GaAs Heterojunction Bipolar Transistor with a Cutoff Frequency of 45 GHz", IEEE IEDM, 1986, pp. 270–273, and the Y. Ota, et al article "AlGaAs/GaAs HBT with GaInAs Cap Layer Fabricated by Multiple-Self-Alignment Process Using One Mask", Electronics Letters, Vol. 25, No. 9, April 1989, pp. 610–612.

SUMMARY OF THE INVENTION

It is an object of the present invention to provide a planar heterobipolar transistor having minimum base-collector surface and a method for the manufacture thereof.

The above object is achieved, according to the present invention, with a heterobipolar transistor on a substrate having a base, an emitter and a collector, and having a sub-collector layer, a collector layer and a layer sequence standard for the emitter-base complex comprising at least one base layer and one emitter layer grown on top of one another, and having a base metalization, a collector metalization and an emitter metalization, the heterobipolar transistor being particularly characterized in that the collector metalization is applied onto the sub-collector layer, a collector parting trench is provided on the grown side of the substrate, the collector parting trench is constructed extending from the surface of the heterobipolar transistor at least down into the collector layer and, at most, down into an upper layer portion of the sub-collector layer and separates the collector metalization from the base and from the emitter, and the collector parting trench is filled with a passivation material for electrical insulation.

According to a particular feature of the invention, the heterobipolar transistor having the structure set forth above, is further particularly characterized in that at least one insulating trench is provided at the grown side of the substrate, the insulating trench effecting a lateral electrical insulation of the heterobipolar transistor laterally towards the exterior, and the insulating trench is constructed extending from the surface of the heterobipolar transistor at least into the substrate.

The above object is also achieved, according to the present invention in a method for manufacturing a heterobipolar transistor of the type just set forth, whereby, in a first step, a sub-collector layer, a collector layer and a layer sequence standard for the base-emitter complex comprising at least one base layer and an emitter layer are grown onto a substrate, in a second step, a first mask having an opening in the region of the collector parting trench to be manufactured is applied, in a third step, the collector parting trench is manufactured by utilizing the first mask, in a fourth step, the collector parting trench is filled with an insulating layer of insulating material, in a fifth step, the surface of the uppermost, grown-on semiconductor layer is exposed, in a sixth step, the base-emitter complex is manufactured in a manner standard for heterobipolar transistors and is provided with the base metalization and with the collector metalization, in a seventh step, a second mask having an opening in the region of the collector to be manufactured is applied, in an eighth step, the collector region is etched out down to the sub-collector layer utilizing the second mask, and, in a ninth step, the collector metalization is applied and the second mask is removed in a lift-off technique.

According to another feature of the invention, in a method of the type just described, in a tenth step, an insulation implantation is introduced into regions at the exposed surfaces of the semiconductor material, and, in an eleventh step, the surface of the heterobipolar transistor is planarized with a passivation layer of an insulating material and connecting metalizations are applied onto the base metalization, the collector metalization, and the emitter metalization.

According to another particular feature of the invention, the method is particularly characterized in that, in the second step, at least one insulating trench is additionally produced with a mask technique.

According to the last-mentioned feature, and according to another feature of the invention, in the second step, a resist mask is first applied and, using the lacquer mask, the at least one insulating trench is manufactured, the resist mask being removed and the first mask being then applied.

According to another particular feature of the invention, each insulating trench is filled with insulating material before the application of the first mask.

According to another feature of the invention, the first mask is applied in the second step as a photoresist mask and this first mask is removed before the fourth step.

According to another feature of the invention, the first mask applied in the second step is a metal mask and this first mask is removed in the fifth step.

According to the invention, the above object is also achieved in a method for manufacturing the heterobipolar transistor wherein, in a first step, a sub-collector layer and a layer sequence standard for heterobipolar transistors comprising a collector layer, a base layer, a buffer layer and an emitter layer are grown on a substrate, in a second step, a third mask having an opening in the collector region to be manufactured is applied, in a third step, the collector region is etched down to the sub-collector layer using the third mask, in a fourth step, the third mask is removed, in a fifth step, the region provided for the collector terminal is filled with an insulating layer, in a sixth step, the surface of the uppermost, grown-on semiconductor layer is exposed, in a seventh step, the base-emitter region is manufactured in a manner standard for heterobipolar transistors and is provided with the base metalization and with the emitter metalization, in an eighth step, the remaining portion of the insulating layer is etched out down to the sub-collector layer whereby a respective portion remains at the lateral edges as a passivation layer, and, in a ninth step, the exposed surface of the sub-collector layer is provided with the collector metalization.

According to another feature of the invention, the method just set forth is particularly characterized in that, in a tenth step, an insulation implantation is introduced into the region at the exposed surfaces of the semiconductor material, and, in an eleventh step, the surface of the heterobipolar transistor is planarized with the passivation of an insulating material and connecting metalizations are applied onto the base metalization, the collector metalization and the emitter metalization.

According to another feature of the invention, the heterobipolar transistor having the additional features of the insulating trench extending from the surface of the heterobipolar transistor in least into the substrate and effecting a lateral electrical insulation of the heterobipolar transistor toward the exterior is particularly characterized during its manufacture in that, in the second step, at least one insulating trench is additionally produced with a mask technique.

According to another feature of the invention and in accordance with the method just set forth, in the second step, a resist mask is first applied and, upon using the resist mask, the at least one insulating trench is manufactured, the resist mask then being removed and the first mask then being applied.

According to another feature of the invention, the method, as just described, is particularly characterized in that each insulating trench is filled with insulating material before the application of the first mask.

According to another feature of the invention, and according to the method just described, the first mask is applied in the second step as a photoresist mask and this first mask is removed before the fourth step.

According to another feature of the invention, and in accordance with the method set forth above, the first mask is applied in the second step as a metal mask, and this first mask is removed in the fifth step.

According to another feature of the invention, the method of making a heterobipolar transistor of the type set forth above, is particularly characterized in that, in a first step, a sub-collector layer and a layer sequence standard for heterobipolar transistors comprising a collector layer, a base layer, a buffer layer and an emitter layer are grown on a substrate, in a second step, a third mask having an opening in the collector region to be manufactured is applied, in a third step, the collector region is etched out down to the sub-collector layer using the third mask, in a fourth step, the third mask is removed, in a fifth step, the region provided for the collector terminal is filled with an insulating layer, in a sixth step, the surface of the uppermost, grown-on semiconductor layer is exposed, in a seventh step, the base-emitter region is manufactured in a manner standard for heterobipolar transistors and is provided with the base metalization and with the emitter metalization, in an eighth step, the remaining portion of the insulating layer is etched down to the sub-collector layer, whereby a respective portion remains at the edge as a passivation layer, and, in a ninth step, the exposed surface of the sub-collector layer is provided with the collector metalization.

According to another feature of the invention, the just-mentioned method is particularly characterized in that, in a tenth step, an insulation implantation is introduced into the region at the exposed surfaces of the semiconductor material, and, in an eleventh step, the surface of the heterobipolar transistor is planarized with a passivation layer of an insulating material and connecting metalizations are applied onto the base metalization, the collector metalization and the emitter metalization.

According to another feature of the invention, and in accordance with the just-mentioned methods and features thereof, the method is particularly characterized in that in the second step, at least one insulating trench is additionally manufactured with a mask technique.

According to another feature of the invention, and in accordance with the just-mentioned feature, in the second step, a resist mask is first applied and the at least one insulating trench is manufactured using the lacquer mask, the resist mask is then removed and the third mask is applied.

According to another feature of the invention, and in accordance with the just-mentioned features, each insulating trench is filled with an insulating material before the application of the third mask.

BRIEF DESCRIPTION OF THE DRAWINGS

Other objects, features and advantages of the invention, its organization, construction and operation will be best understood from the following detailed description, taken in conjunction with the accompanying drawings, on which:

FIGS. 10 and 11 illustrate cross sectional view through the respective structure after two following steps in a manufacturing method according to the present invention; and FIGS. 12-16 illustrate cross-sectional views through the respective structure after five different steps in an alternative, third method of manufacture according to the present invention.

DESCRIPTION OF THE PREFERRED EMBODIMENTS

A separation of the collector terminal from the base-emitter complex is what is of particular importance in the heterobipolar transistor constructed in accordance with the present invention. This separation is effected by a collector parting trench between the base-emitter complex and the contact metalization for the collector. The exemplary embodiment of FIG. 1 illustrates what is otherwise a conventional structure of the base-emitter complex, whereby the collector terminal is separated by a collector parting trench and an electrical connection to the collector layer occurs via a sub-collector layer.

Figure 1:
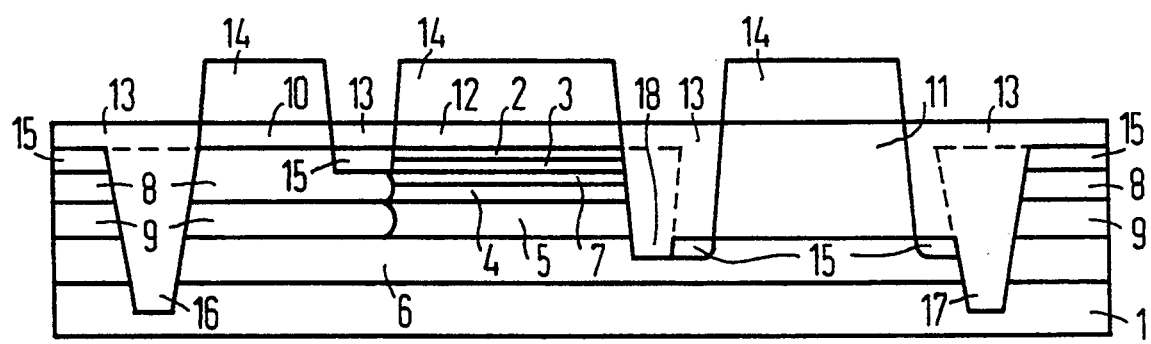
FIG. 1 is a sectional view of a specific embodiment of a heterobipolar transistor constructed in accordance with the present invention.

In the structure of FIG. 1, a sub-collector layer 6 is grown on a substrate 1. A collector layer 5, a base layer 4, a buffer layer 7, an emitter layer 3 and a cover layer 2 follow successively thereon in the region of the base-emitter complex. This layer sequence can be replaced by some other sequence described in the literature. It is also possible to interchange the arrangement of the base and the emitter. The base layer 4 and the further layers grown thereon are provided with a first implantation 8 in the region of the base. A second implantation 9 is correspondingly undertaken in the region of the collector layer 5 located therebelow. The base is provided with a base metalization 10 and the emitter is provided with an emitter metalization 12. The collector metalization 11 is applied directly on the sub-collector layer 6 outside of the base-emitter complex. The collector metalization 11 is electrically insulated from the base-emitter complex by a collector parting trench 18 that is filled with a passivation layer 13 of insulating material. An electrically-conductive connection is therefore only present in the sub-collector layer 6.

The heterobipolar transistor, as described above, is electrically insulated towards the outside, for example, from further function elements located on the substrate by a first insulating trench 16 and by a second insulating trench 17 which are filled with electrically-insulating passivation material 13. What are shown as first and second insulating trenches 16, 17 in FIG. 1 can also be the respective cross-sectional surfaces of a single insulating trench that extends as a ring about the transistor. Those parts of the surface of the semiconductor material that are not provided with metalizations are respectively provided with insulation implantations 15 and the entire surface between the metalizations is covered by the passivation layer 13. A respective connecting metalization 14 by way of which the electrical linking of the terminals occurs is applied on the base metalization 10, the emitter metalization 12 and the collector metalization 11.

The expitaxially-grown layers of III-V material can be, for example, the material system of AlGaAs/GaAs, InGaAs/InP, InGaAs/InAlAs. In this structure of the invention, the parasitic base-collector surface is minimal because the interface between the interior of the HBT, i.e. between the base-emitter complex and the collector terminal, is defined with the planarized, filled collector parting trench 18 on the sub-collector layer 6.

Figure 2:
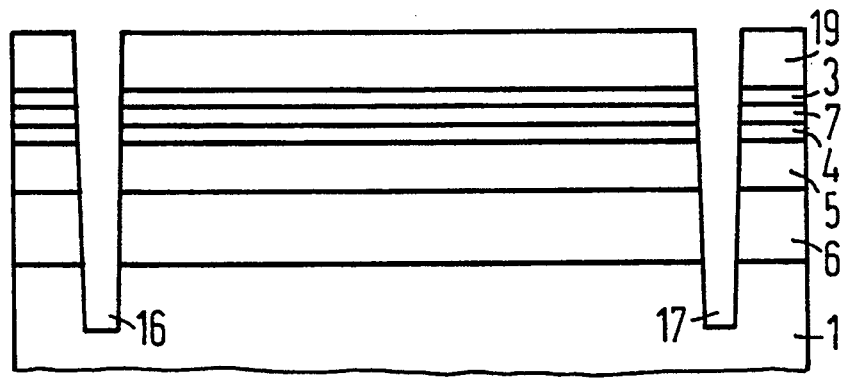
FIGS. 2-5 illustrate cross sectional views through the respective structure after four method steps of the present invention.
Figure 3:
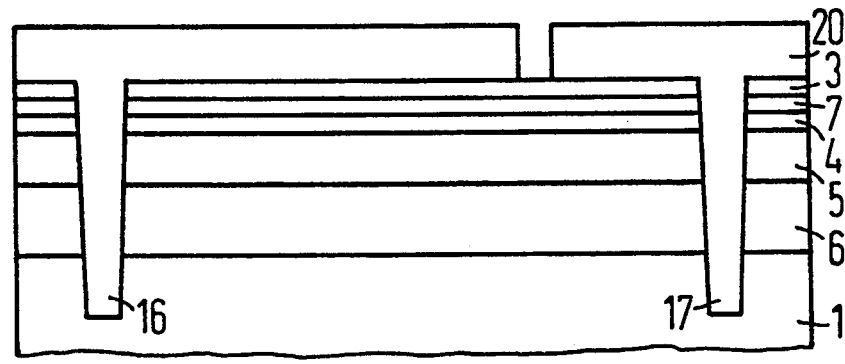
Figure 4:
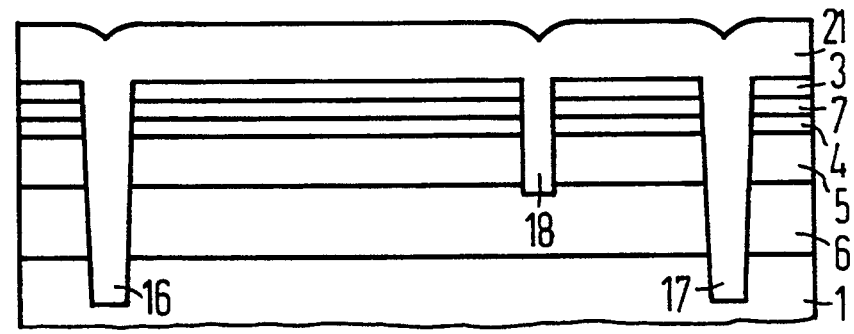
Figure 5:
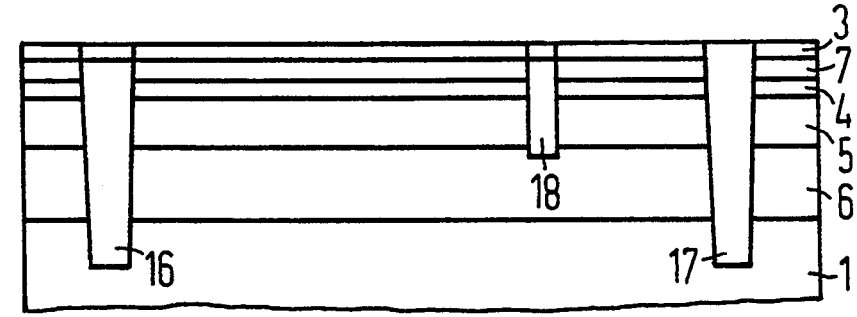

This heterobipolar transistor of the present invention is manufactured, for example, in the following manner. First, the sub-collector layer 6, the collector layer 5 and the layer sequence required for the base-emitter complex (for example, the base layer 4, the buffer layer 7 and the emitter layer 3) are grown on a substrate 1. Insulating trenches 16, 17 are produced as needed with a mask technique. FIG. 2 illustrates the structure in a cross-sectional view with a resist mask 19 applied with whose assistance a first insulating trench 16 and a second insulating trench 17 were etched out. In accordance with FIG. 3, a first mask 20 of, for example, photoresist material having an opening in the region of the collector parting trench to be produced is applied. The collector parting trench is etched with a reactive ion etching (RIE) process or an electron cyclotron resonance reactive ion etching (ECR-RIE) process which is compatible for III-V semiconductor material. After etching, the first mask 20 is removed and the collector parting trench 18 as well as, potentially, the insulating trenches 16 and 17 are filled with an insulation material. This insulation layer 21 can be, for example, photonitride $Si_3N_4$ or $SiO_2$. The surface is subsequently planarized, this potentially occurring, for example, with a (low-damage) etching process suitable for the insulating layer 21 that is selected vis-a-vis III-V semiconductor material. For example, $SF_6$ is thereby utilized in an ECR-RIE process for an insulating layer 21 of $Si_3N_4$. As FIG. 5 illustrates, the surface of the semiconductor material (the emitter layer 3 in the present example) is thereby exposed. The depth of the collector parting trench 18 is selected such that the bottom of the collector parting trench 18 lies either inside the collector layer 5, i.e. under the next semiconductor layer grown thereon (the base layer 4 in the present example), in any case or lies in an upper layer portion of the sub-collector layer 6.

The wall of the collector parting trench 18 lying at the side of the emitter or, respectively, of the base forms the boundary of the active transistor region. The tolerance that must be observed for the depth of the collector parting trench 18 approximately corresponds to the thickness of the collector layer 5.

Figure 6:
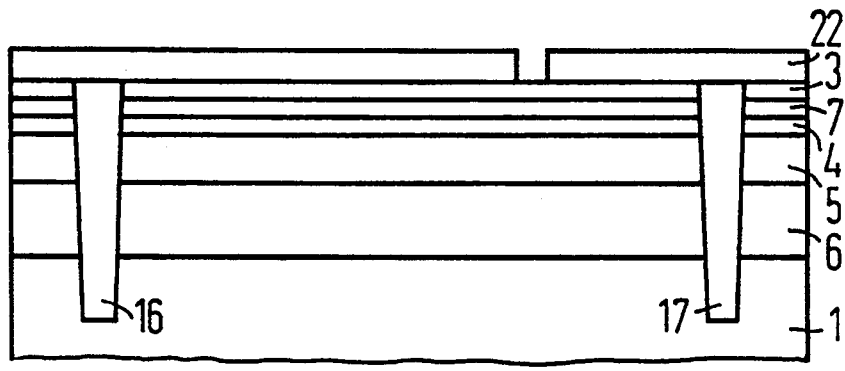
FIGS. 6-9 illustrate cross sectional views through the respective structure after four different steps of an alternative method of manufacture according to the invention.
Figure 7:
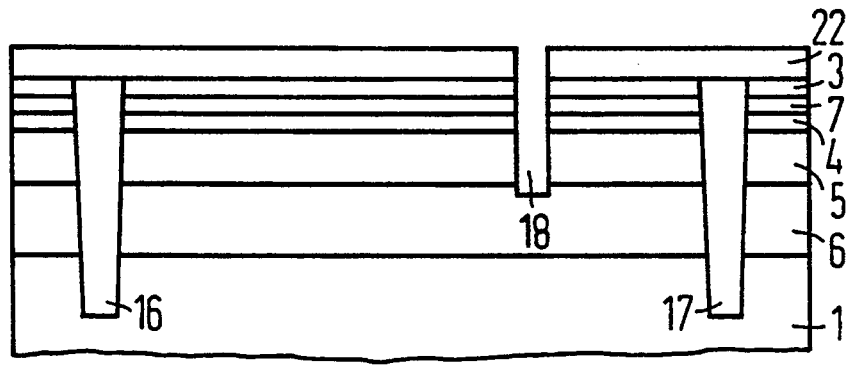
Figure 8:
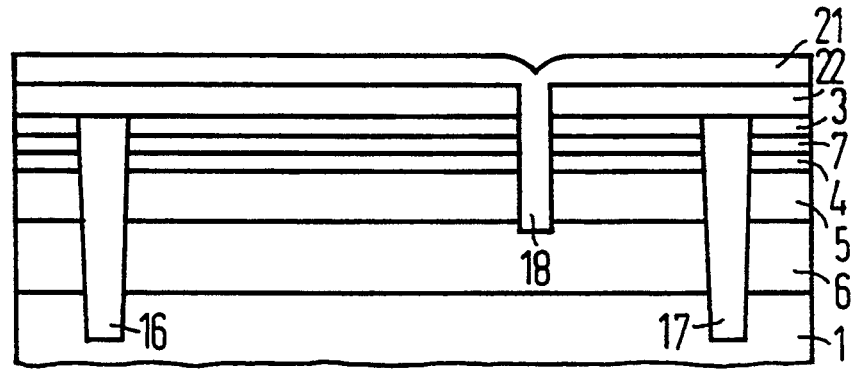
Figure 9:
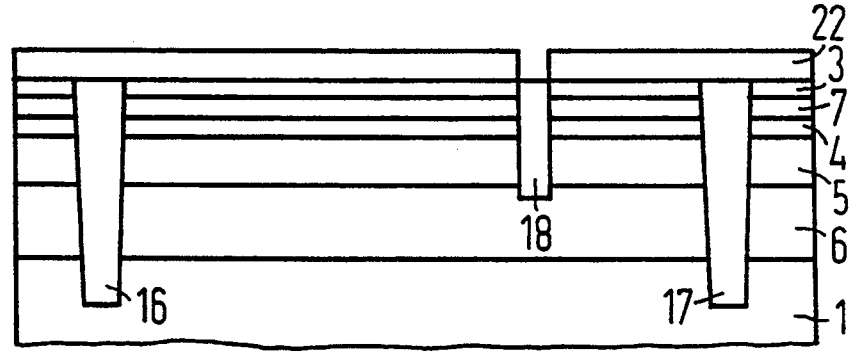

As an alternative to these method steps, a first mask 22 of metal can also be employed. FIG. 6 illustrates a structure in a cross-sectional view wherein, after the growth of the layers of the semiconductor material and the etching of the insulating trenches 16, 17, the insulating trenches 16, 17 were filled with insulating material. At a first mask 22 of metal having an opening in the region of the collector parting trench 18 to be produced was subsequently applied. For example, this metal mask can be titanium having a thickness of approximately 400 nm. A dry etching on the basis of reactive ion beam etching (RIBE) or with an ion etching process (RIE) compatible with III-V semiconductor material or with an (ECR-RIE) process compatible with III-V semiconductor material subsequently occurs. The collector parting trench 18 is etched out down to the depth of the collector layer 5 with this dry etching process. Subsequently, the collector parting trench 18 is filled with an insulation layer 21 (FIG. 8). For example, photonitride $Si_3N_4$ or $SiO_2$ can be employed for this purpose. The first mask 22 thereby remains in place. The insulation layer 21 may potentially be additionally leveled with a further photoresist layer (for example, AZ 111). Subsequently, the insulation layer 21 is re-etched on a surface-wide basis, for example with an RIE process or an ECR-RIE process step that is compatible with the material of the insulation layer 21. The remaining portion of the insulating layer 21 after this step fills the collector reparting trench 18 and planarizes the collector parting trench 18. The semiconductor layers provided for the active HBT complex are protected by the remaining, first mask 22 of metal (see FIG. 9). The first mask 22 is subsequently chemically wet etched and removed (for example, with an etchant containing phosphoric acid when the first mask 22 is composed of titanium).

Proceeding from the structures illustrated in the cross-sectional view of FIG. 5, the base-emitter complex is subsequently produced in an inherently-known manner. FIG. 10 shows the corresponding structure with a finished base-emitter complex and with an applied, second mask 23 (for example, a photoresist) having an opening for the collector terminal to be produced. This entire region between the collector parting trench 18 and, potentially, an insulating trench 17 is etched out (below the arrows 26). The layer sequence including the collector layer 5 is thereby eroded at least until the surface of the sub-collector layer 6 is exposed in this region. According to FIG. 11, the collector metalization 11 is then applied and the remaining metal on the second mask 23 is removed together with this second mask 23 in a lift-off technique. Insulation implantations 15 can be subsequently introduced and the surface can be planarized with a passivation layer 13. The structure corresponding to FIG. 1 is therefore obtained.

The structure of the base-emitter complex in the heterobipolar transistor constructed in accordance with the present invention is not fixed, but can comprise various, known structures. A mesa-structured embodiment also comes into consideration instead of a planar embodiment. What is critical is that a planarization of the collector is possible in providing the structure in accordance with the present invention. Specific advantages of the heterobipolar transistor of the present invention are, in particular, that the collector parting trench filled with an insulating material replaces the parasitic base-collector surface between the emitter and the collector or, respectively, between the base and the collector usually present in a non-self-aligned base-collector or, respectively, emitter-collector junction. For a heterobipolar transistor having a self-adjusted emitter-base complex (SA E-B-HBT) with $2 \times 5$ $\mu m^2$ emitter and base area and a spacing of 2 $\mu m$ from the emitter to the collector terminal, for example, this means a reduction of the base-collector surface in the emitter-base complex by 30%. When what are otherwise identical parameters are assumed for the heterobipolar are assumed for the heterobipolar transistor, then the collector charging time $t_{cc}$ is reduced by 30% as a consequence of this measure, the emitter charging time $t_E$ is reduced by just 30% in accordance with the ratio of base-emitter and base-collector capacitance, i.e. the transit frequency of the charge carriers $f_T = 1/[2\pi(t_E + t_B + t_C + t_{CC})]$ is considerably increased, where $t_B$ and $t_C$ denote the base transit time and the collector transit time, respectively, of the charge carriers. The limit frequency of the current gain $f_{max} = [f_T/(8\pi \cdot R_B \cdot C_{BC})]^{\frac{1}{2}}$ is increased, leaving the implicit increase of $f_T$ by another 20% out of consideration. Here $R_3$ is the base bulk resistance and $C_{BC}$ is the base-collector capacitance.

Even after the planarization of the collector parting trench, the base-emitter complex can be produced in a known manner as a self-aligned or non-self-aligned planar or mesa-structured base-emitter complex. What is critical is that the emitter metalization 12 can be undertaken in a phototechnique that is not critical with respect to the collector parting trench 18 in the case of an asymmetrical heterobipolar transistor (see FIG. 1) having only one respective base and emitter terminal. The sidewall of the applied emitter metalization 12 located at the side of the collector in an ideal realization of the HBT of the present invention terminates with the upper edge of the collector parting trench located at the side of the emitter. It is acceptable when the metal of the emitter metalization projects beyond the upper edge of the collector parting trench by a few tenths of a micrometer ($\mu m$). The analogous case holds true for a symmetrical HBT having two base terminals for the base terminal at the collector side.

A further advantage of the collector parting trench is comprised in the free selection of the structuring of the collector terminal over the sub-collector layer 6. One can proceed in the following manner after the manufacture of the base-emitter complex: the collector recess is defined with an uncritical phototechnique. The collector recess is etched with a wet chemical etching process (for example, an ammonia agent for the material system of AlGaAs/GaAs) and this is selective vis-a-vis the passivating insulating layer 21 in the collector parting trench 18 or with a dry etching process (for example an RIBE or RIE or ECR-RIE process for III-V semiconductor material) or is etched in a combination of dry chemical and wet chemical etching processes down to the sub-collector layer 6; the surface of the sub-collector layer 6 is thereby exposed in the region of the collector recess. As a result of the filled-out collector parting trench, the heterolayer sequence in the inner HBT (base-emitter complex) remains protected.

It is thereby advantageous when the edges of the photoresist material project beyond the collector parting trench (for example, a few tenths of a $\mu m$ through approximately 0.5–0.7$\mu m$. As a result thereof, an intentional underetching of the photoresist material down to the upper edge of the collector parting trench is achieved on the basis of an at least partially isotropic etching process. This underetching promotes the following lift-off technique and the subsequent application of the collector metalization 11 for the collector terminal. This collector metalization 11 can be applied and alloyed in an arbitrary thickness, for example, up to the height of the base metalization 10 and of the emitter metalization 12.

The entire HBT is now passivated, this potentially occurring with a supplementation of the insulation layer 21 with a further $Si_3N_4$ or $SiO_2$ layer. The insulation layer 21 is therefore expanded such that the remaining interspaces between the part of the insulation layer 21 in the collector parting trench 18 and the collector metalization layer 11 are closed. In the same manner as the planarization of the material introduced into the collector parting trench 18 was undertaken, the insulation layer 21 (with a leveling photoresist thereon) is planarly etched back down to the height of the emitter metalization 12, of the base metalization 10 and of the collector metalization 11. With a further phototechnique or planar topology, the circuit can be reliably connected with a connecting metalization 14 with a connecting metal true-to-structure and without problems (see FIG. 1).

When a passivation layer is required that is thicker than the emitter metalization 12 and the base metalization 10, the connecting metalization 14 can also be applied in that via holes therethrough by way of which the connecting metalization 14 is then applied onto the emitter, base and collector metalizations 12, 10 and 11, are etched through this thicker passivation layer.

FIG. 1 illustrates a cross sectional view through a planar HBT with a collector constructed in accordance with the present invention having the collector parting trench 18 and a passivation layer 13 that extends in the insulating trenches 16, 17 up to the non-conducting substrate 1 for insulating the entire heterobipolar transistor from laterally adjoining function elements. It is possible to design circuits especially compact with this additional electrical insulation on the basis of further insulating trenches. These insulating trenches are manufactured analogously to the collector parting trench. Given the use of the mask technique, the insulation by introducing insulating material (the passivation layer 13) into the insulating trenches 16, 17 provided therefore can be undertaken in an arbitrary step in the manufacturing process. The introduction of the passivation layer 13 following the application of the collector metalization 11 is particularly advantageous since it simplifies the manufacturing process. The passivation layer 13 can then be applied in a method step and, simultaneously therewith, the insulating trenches and the interspaces in the collector region can be filled.

Figure 12:
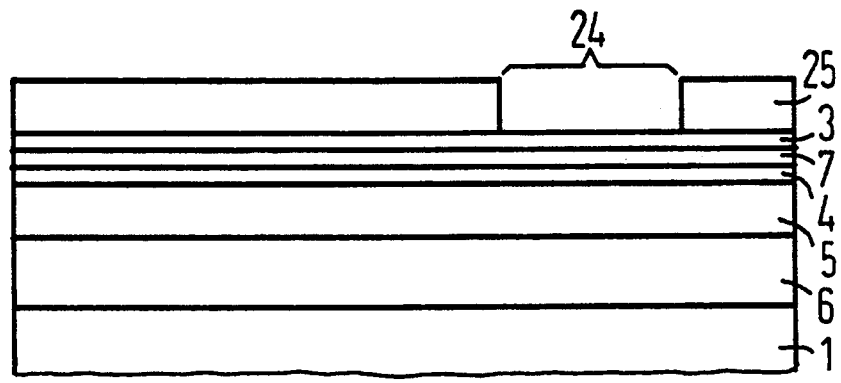
Figure 13:
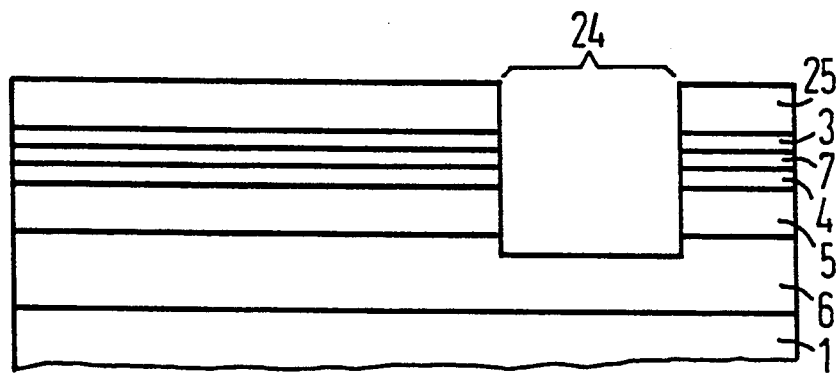
Figure 14:
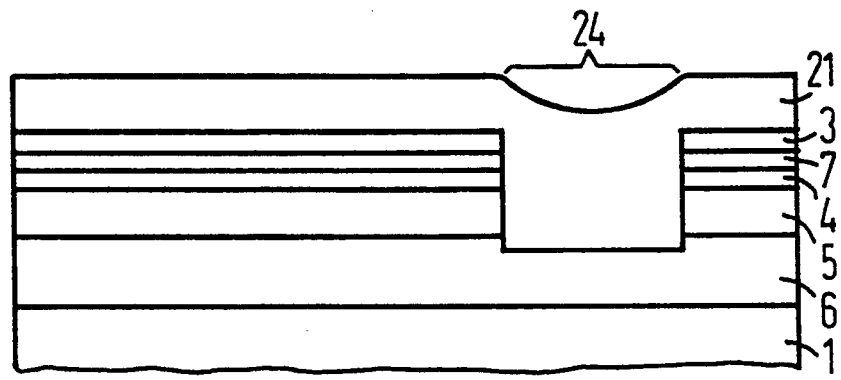
Figure 15:
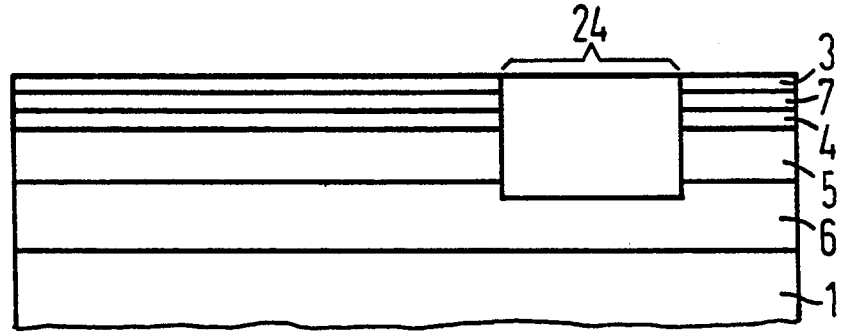

FIGS. 12–16 illustrate cross sections through the structures after five different method steps of an alternative manufacturing method. In this modification of the manufacturing method, the entire region for the collector terminal is exposed with a mask technique instead of the collector parting trench. FIG. 12 illustrates this structure having the layer sequence of sub-collector layer 6, collector layer 5 and the further layers (base layer 4, buffer layer 7, emitter layer 3) on the substrate 1 and with a third mask 25 of resist or metal applied on the uppermost layer and having an opening in the region 24 that is provided for the collector terminal. Upon application of one of the above-mentioned etching processes, the semiconductor material of the grown-on layers up to and including the collector layer 5 is etched off in the region 24 for the collector terminal, so that the surface of the sub-collector layer 6 is exposed in this region 24, but at most an upper layer portion of the sub-collector layer 6 is co-eroded (FIG. 13). Subsequently, this collector recess is filled with an insulating layer 21 (FIG. 14) and is planarized (FIG. 15). The surface of the semiconductor material outside of the collector recess is thereby exposed.

The region for the connection of the collector is defined before or after the manufacture of the emitter-base complex, whereby a non-critical phototechnique within the already insulated collector terminal region is realized for the emitter-base complex. In the passivation layer that is formed by that portion of the insulating layer 21 located in the collector recess, an opening is etched into the passivation material with an at least partially isotropic etching (underetching of a further, applied photoresist mask), so that a portion of the surface of the sub-collector layer 6 is exposed in the region 24 of the planned collector terminal. According to FIG. 16, the collector metalization 11 is applied after this up to the planned height (for example, up to the height of the base and emitter metalizations 10, 12). This occurs, for example, with a lift-off technique. Of the applied insulating layer 21, only portions thereof remain as the passivation layer 13 in the collector recess between the wall thereof and the collector metalization 11. The interspace between the remaining portions of insulating material and the collector metalization 11 can then be filled with a further passivation material with which the surface can be additionally planarized, i.e. the interspaces between the base metalization 10, the emitter metalization 12 and the collector metalization 11 can be filled. In this alternative manufacturing method, also, there is no restriction for the design of the base-emitter complex.

In the heterobipolar transistor constructed in accordance with the present invention, the base-collector boundary surface is limited to the base-emitter region of the self-aligned or non-self-aligned emitter-base complex. The structure of the heterobipolar transistor constructed in accordance with the present invention enables a free manipulation in the etching of the collector recess (dry chemical and/or wet chemical), whereby the etching no longer has an influence on the properties of the inner portion of the HBT, i.e. on the base-emitter complex. There is therefore likewise a free selection in the layer thickness of the metalization in the application of the collector metalization. Thick layer thicknesses of the metalization as required for a planar HBT thereby do not lead to any shorts between the emitter and the collector or, respectively, the base and the collector.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method of making a heterobipolar transistor of the type which has a substrate, an emitter, a base, and a collector supposed by said substrate, and which comprises a sub-collector layer of semiconductor material on said substrate, a collector layer of semiconductor material on said sub-collector layer, a layer sequence of semiconductor material for a base-emitter complex on said collector layer including at least one base layer and one emitter layer grown on top of one another and defining an upper surface, a collector metalization on said sub-collector layer, a collector parting trench between said collector metalization and said layer sequence, said collector parting trench extending from said upper surface of said layer sequence at least into said collector layer and at the most into an upper layer potion of said sub-collector layer, and passivation material filling said collector parting trench, comprising the steps of:

(a) growing the sub-collector layer, the collector layer and the layer sequence onto the substrate;

(b) masking the upper surface with a first mask to define an open mask region for the collector parting trench;

(c) removing semiconductor material through the first mask in the open mask region from the upper surface at least down into the collector layer and at most into an upper layer portion of the sub-collector region to form the collector parting trench;

(d) filling the collector parting trench with insulating material;

(e) removing the first mask to expose the upper surface;

(f) applying a base metalization to the base and an emitter metalization to the emitter;

(g) masking the upper surface and the metalizations with a second mask to define an open mask region for the collector;

(h) etching out the layer structure down to the sub-collector layer;

(i) applying the collector metalization directly on the exposed sub-collector layer; and (j) removing the second mask.

2. The method of making a heterobipolar transistor according to claim 1, and further comprising the steps of:

(k) implanting insulation into regions of the exposed semiconductor material;

(l) planarizing the heterobipolar transistor by applying a layer of passivation insulating material onto the upper surface and any recesses therein; and (m) applying connecting metalizations onto the layer of passivating insulating material above the base, the emitter and the collector metalizations.

3. The method of claim 1, wherein the heterobipolar transistor further comprises at least one insulating trench laterally spaced from the collector parting trench and extending from the upper surface at least into the substrate to laterally electrically insulate the transistor towards the outside from further function elements, wherein the step (b) of masking is further defined as:

(b1) masking the upper surface with additional mask to define an additional open mask region, spaced from the open mask region produced by said first mask, to define a location for the at least one insulating trench;

(b2) removing semiconductor material through the additional mask open region from the upper surface down to at least into the substrate to form the trench of the at least one insulating trench.

4. The method of claim 3, wherein:

the step (b1) is further defined as (b1a) applying a laquer mask over the upper surface to cover all portions therebelow which are not to be removed;

the step (b2) is further defined as (b2a) etching out the semiconductor material through the lacquer mask to form the trench; and further comprising the step of:

(b3) removing the lacquer mask prior to the step (b) of masking with a first mask.

5. The method of claim 4, and further comprising the step of:

(b4) filling the at least one insulating trench with insulating material prior to the step (b) of masking with the first mask.

6. The method of claim 1, wherein the steps (b) and (d) of masking the upper surface with a first mask and filling the collector parting trench with insulating material are further defined as:

(b1) applying photoresist as the first mask; and (d1) removing the photoresist before filling the trench with insulating material.

7. The method of claim 1, wherein the steps (b) and (e) of masking the upper surface with a first mask and removing the first mask are further defined as:

(b1) applying a metal mask as the first mask; and (e1) removing the metal mask.

8. A method for manufacturing a heterobipolar transistor of the type which has a substrate, an emitter, a base, and a collector supported by the substrate, and which comprises a sub-collector layer of semiconductor material on the substrate, a collector layer of semiconductor material on the sub-collector layer, a layer sequence of semiconductor material for a base-emitter complex on the collector layer including at least one base layer, a buffer layer and an emitter layer grown on top of one another and defining an upper surface, a collector metalization on the sub-collector layer, a collector parting trench between the collector metalization and the layer sequence, the collector parting trench extending from the upper surface of the layer sequence at least into the collector layer and at the most into an upper layer portion of the sub-collector layer, and passivation material filling the collector parting trench, comprising the step of:

(a) growing the sub-collector layer, and a layer sequence comprising the collector layer, the base layer, the buffer layer, and the emitter layer on top of one another on the substrate;

(b) applying a first mask on the upper surface including an open region defining the location of the collector;

(c) etching out the semiconductor material from said location from the upper surface down to the sub-collector layer to form a recess;

(d) removing the first mask;

(e) filling the recess with insulating material;

(f) exposing the upper surface of the uppermost grown semiconductors layers;

(g) forming a standard base-emitter region and applying a base metalization and an emitter metalization;

(h) selectively etching out the insulation in the recess down to and to expose a surface portion of the sub-collector layer leaving an edge portion of the insulation for passivation; and (i) applying a collector metalization directly to the exposed surface portion of the sub-collector layer.

9. The method of claim 8, and further comprising the steps of:

(j) planarizing the upper surface of the transistor by applying passivating insulating material over the upper surface of the transistor; and (k) applying connecting metalizations to the base, emitter and collector metalizations.

10. The method of claim 8, for making a heterobipolar transistor which further comprises at least one insulating trench laterally spaced from the collector parting trench and extending from the upper surface at least into the substrate to laterally electrically insulate the transistor towards the outside from other functional elements, wherein, prior to the step (b) of applying a first mask, comprising the further steps of:

(a1) applying a prior mask over the upper surface to define the location of at least one insulating trench; and (a2) etching out the at least one defined location from the upper surface down at least into the substrate to form at least one insulating trench.

11. The method of claim 10, wherein the step (a1) is further defined:

(a1a) applying lacquer as the prior mask; and (a1b) removing the lacquer after the step (a2) of etching and prior to the step (b) of applying a first mask.

12. The method of claim 10, and further comprising the step of:

(a3) filling the at least one insulating trench with insulating material prior to the step (b) applying a first mask.

* * * * *